(12) United States Patent
Lee et al.

(10) Patent No.: US 6,495,476 B1
(45) Date of Patent: Dec. 17, 2002

(54) METHOD FOR PREVENTING NATIVE OXIDE GROWTH DURING NITRIDATION

(75) Inventors: Cheng-Che Lee, Taichung County (TW); Chung-Chih Liu, Hsin-chu (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 09/642,939

(22) Filed: Aug. 22, 2000

(51) Int. Cl.[7] .............................................. H01L 21/31
(52) U.S. Cl. ...................................... 438/775; 438/791
(58) Field of Search ................................. 438/775, 776, 438/791, 763; 437/242

(56) References Cited

U.S. PATENT DOCUMENTS

| | | | |
|---|---|---|---|
| 5,032,545 A | * 7/1991 | Doan et al. ................. | 437/242 |
| 5,482,739 A | * 1/1996 | Hey et al. ................. | 427/255.2 |
| 5,633,202 A | * 5/1997 | Brigham et al. ............ | 438/763 |
| 5,899,752 A | * 5/1999 | Hey et al. .................. | 438/791 |
| 6,171,977 B1 | * 1/2001 | Kasai et al. ................ | 438/775 |

* cited by examiner

*Primary Examiner*—David Nelms
*Assistant Examiner*—David Vu
(74) *Attorney, Agent, or Firm*—Finnegan, Henderson, Farabow, Garrett & Dunner, LLP

(57) ABSTRACT

A method for forming a layer of silicon nitride that includes providing at least one silicon wafer in a first chamber with ammonia gas, wherein the first chamber is substantially enclosed, and the at least one silicon wafer reacts with the ammonia gas to form a first layer of silicon nitride on the at least one silicon wafer, providing a second chamber with the ammonia gas, moving the at least one silicon wafer into the second chamber, and forming a second layer of silicon nitride on the silicon wafer.

8 Claims, No Drawings

METHOD FOR PREVENTING NATIVE OXIDE GROWTH DURING NITRIDATION

BACKGROUND OF THE INVENTION

1. Field of the Invention

This invention pertains in general to a method for manufacturing a semiconductor device and, more particularly, to a method for preventing native oxide growth during the formation of a silicon nitride layer.

2. Description of the Related Art

The presence of native oxide, or silicon dioxide ($SiO_2$), in certain components of a semiconductor device may result in unintended electrical characteristics. For example, the presence of native oxides at capacitor nodes lowers the dielectric constant of the capacitor, which lowers the capacitance, and therefore results in abnormal resistance-capacitance electrical characteristics. Thus, in a conventional semiconductor manufacturing process, a silicon wafer is usually cleaned with a diluted hydrogen fluoride (HF) solution to remove native oxides.

However, undesired native oxides may reappear during subsequent manufacturing steps, such as during the formation of a silicon nitride ($Si_3N_4$) layer. For a manufacturing process in which layer of silicon nitride is grown, a silicon wafer is placed inside a cassette that holds a plurality silicon wafers. The cassette is placed inside an area of a furnace known as a "load lock." To prevent native oxides from forming before the nitridation process, the load lock is filled with nitrogen gas to dilute the concentration of oxygen present in the load lock to suppress oxidation of the silicon wafer. After the load lock is filled with nitrogen gas, the cassette containing the wafers is transferred by a robotic arm into an apparatus known as a "boat," and the boat is generally transferred upwardly into the furnace chamber. This is known as "boat up." Again to prevent native oxides from forming, the furnace chamber is filled with nitrogen gas during boat up. After the boat is placed inside the furnace chamber, a vacuum is created inside the furnace chamber, a procedure known as "pump down," after which ammonia gas ($NH_3$) is supplied inside the furnace chamber to begin the nitridation process.

Native oxides may still form during the above conventional manufacturing process because oxygen cannot be completely removed from the load lock or inside the furnace chamber because furnace door must be opened so that the wafers may be placed inside and removed from the furnace. Therefore, despite an attempt to purge oxygen from the load lock area with nitrogen gas, oxidation of the wafers at load lock still occurs both during the transfer to boat and the boat up. Furthermore, oxidation not only occurs inside the furnace chamber during boat up but at an accelerated rate due to the elevated temperature inside the furnace chamber.

The same undesired oxidation process also occurs in a chemical-vapor deposition ("CVD") process in which silicon nitride is deposited.

SUMMARY OF THE INVENTION

Accordingly, the present invention is directed to a method for preventing native oxide growth during the formation of a silicon nitride layer that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof.

To achieve these and other advantages, and in accordance with the purpose of the invention as embodied and broadly described, there is provided a method for forming a layer of silicon nitride that includes providing at least one silicon wafer in a first chamber with ammonia gas, wherein the first chamber is substantially enclosed, and the at least one silicon wafer reacts with the ammonia gas to form a first layer of silicon nitride on the at least one silicon wafer, providing a second chamber with the ammonia gas, moving the at least one silicon wafer into the second chamber, and forming a second layer of silicon nitride on the silicon wafer.

In one aspect of the invention, the step of moving the at least one silicon wafer into the second chamber includes moving the at least one silicon wafer into a chemical vapor deposition chamber.

In another aspect of the invention, the step of forming a second layer of silicon nitride includes depositing silicon nitride on the at least one silicon wafer.

In still another aspect of the invention, the step of forming a second layer of silicon nitride includes growing a layer of silicon nitride on the at least one silicon wafer.

In yet another aspect of the invention, the method further includes sealing the first chamber with nitrogen gas at a pressure greater than one atmosphere to prevent the ammonia gas from escaping from the first chamber.

It is to be understood that both the foregoing general description and the following detailed description are exemplary and explanatory and are intended to provide further explanation of the invention as claimed.

DETAILED DESCRIPTION OF THE PREFERRED EMBODIMENTS

In accordance with the present invention, there is provided a method for preventing native oxide growth during the formation of a silicon nitride layer. For a nitridation process where silicon nitride is grown on the surface of a silicon wafer, a plurality of silicon wafers are placed inside a cassette. The method of the present invention may optionally include a cleaning step using a diluted hydrogen fluoride (DHF) solution to remove native oxide that may be present on the silicon wafers. The cassette containing the plurality of silicon wafers is placed inside a load lock area of the furnace. After the cassette is placed inside the load lock, ammonia gas ($NH_3$) is provided inside the load lock. The ammonia gas inside the load lock reacts with the silicon wafers to form a layer of silicon nitride on the surfaces of the silicon wafers. The layer of silicon nitride prevents oxidation of the silicon wafers from occurring. During the period, the wafers in the cassette are transferred into a boat by a robotic arm. Before the boat is placed inside a furnace, ammonia gas ($NH_3$) is provided inside the furnace. The boat is then transferred to the furnace chamber. The furnace chamber has a temperature higher than that of the load lock area of the furnace. After the boat is transferred inside the furnace chamber, the temperature of the furnace chamber is increased to facilitate further nitridation of the silicon wafers.

In operation, the ammonia gas and the silicon wafers create a nitridation process wherein a layer of silicon nitride is formed on the surfaces of the plurality of silicon wafers. The layer of silicon nitride acts as a barrier between silicon material of the silicon wafers and oxygen to prevent oxidation from occurring. Therefore, no native oxide is grown on the surfaces of the plurality of the silicon wafers.

Additionally, for a nitride forming process where silicon nitride is deposited on the surface of a silicon wafer with a CVD machine, which is substantially enclosed and includes a tray or plate is used to hold a single silicon wafer. A cassette containing a plurality of silicon wafers is then placed inside a load lock of the CVD machine. Before one of the plurality of silicon wafers is placed inside a CVD machine, which includes a plurality of chambers, ammonia gas is first provided inside the load lock of the CVD machine. The ammonia gas and the silicon wafer react to create a layer of silicon nitride, which prevents oxidation of the silicon wafer. One of the plurality of chambers is provided with ammonia gas as well. The silicon wafer is then transferred to the chamber filled with ammonia gas. The temperature of the chamber is increased and the CVD process begins by depositing a layer of silicon nitride on the surface of the silicon wafer.

Although a furnace and a CVD machine are substantially enclosed, some ammonia gas may nevertheless leak out. To protect the health of operators and those inside the manufacturing facility, nitrogen gas may be used to seal the perimeters of the furnace and the CVD machine to prevent the ammonia gas from escaping. The nitrogen gas is applied at a pressure greater than one atmosphere.

Alternatively, a ventilation system may be install on one end of the furnace chamber opposite from where the boat enters the furnace chamber. The ammonia gas is thus directed to an outlet ventilation pipe.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a layer of silicon nitride, comprising:

providing ammonia gas to a loadlock;

providing at least one silicon wafer in the loadlock already provided with the ammonia gas, wherein the loadlock is substantially enclosed, and the at least one silicon wafer reacts with the ammonia gas to form a first layer silicon nitride on the at least one silicon wafer;

providing a process chamber with the ammonia gas;

moving the at least one silicon wafer from the loadlock into the process chamber; and forming a second layer of silicon nitride on the silicon wafer.

2. The method as claimed in claim 1, wherein the step of moving the at least one silicon wafer into the process chamber includes moving the at least one silicon wafer into a chemical vapor deposition chamber.

3. The method as claimed in claim 1, wherein the step of forming a second layer of silicon nitride includes depositing silicon nitride on the at least one silicon wafer.

4. The method as claimed in claim 1, wherein the step of moving the at least one silicon wafer into the process chamber includes moving the at least one silicon wafer into a furnace chamber.

5. The method as claimed in claim 1, wherein the step of forming a second layer of silicon nitride includes growing a layer of silicon nitride on the at least one silicon wafer.

6. The method as claimed in claim 1, wherein the step of forming a second layer of silicon nitride includes a step of raising the temperature of the process chamber.

7. The method as claimed in claim 1 further comprising sealing the loadlock with nitrogen gas at a pressure greater than one atmosphere to prevent the ammonia gas from escaping the loadlock.

8. The method as claimed in claim 1 further comprising directing the ammonia gas out of the process chamber in a same direction as the direction that the at least one silicon wafer is placed into the process chamber.

* * * * *